(12) United States Patent
Jin

(10) Patent No.: US 11,011,613 B2
(45) Date of Patent: *May 18, 2021

(54) FLEXIBLE SUBSTRATE WITH HIGH DIELECTRIC-CONSTANT FILM AND MANUFACTURING METHOD THEREOF

(71) Applicant: Wuhan China Star Optoelectronics Semiconductor Display Technology Co., Ltd., Wuhan (CN)

(72) Inventor: Peng Jin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 7 days.

This patent is subject to a terminal disclaimer.

(21) Appl. No.: 16/340,161

(22) PCT Filed: Feb. 18, 2019

(86) PCT No.: PCT/CN2019/075337
§ 371 (c)(1),
(2) Date: Apr. 8, 2019

(87) PCT Pub. No.: WO2020/113822
PCT Pub. Date: Jun. 11, 2020

(65) Prior Publication Data
US 2020/0176579 A1 Jun. 4, 2020

(30) Foreign Application Priority Data
Dec. 4, 2018 (CN) .......................... 201811470216.9

(51) Int. Cl.
*H01L 21/02* (2006.01)
*H01L 21/28* (2006.01)
(Continued)

(52) U.S. Cl.
CPC .... *H01L 29/4908* (2013.01); *H01L 21/02194* (2013.01); *H01L 21/02282* (2013.01);
(Continued)

(58) Field of Classification Search
CPC ......... H01L 21/02194; H01L 21/02282; H01L 29/78603; H01L 29/66757;
(Continued)

(56) References Cited

U.S. PATENT DOCUMENTS 6,501,178 B1 * 12/2002 Kuriyama ........... H01L 23/5226
257/758
2004/0104395 A1 * 6/2004 Hagimoto ............. H01L 33/405
257/79

(Continued)

*Primary Examiner* — Monica D Harrison
*Assistant Examiner* — John Lin

(57) ABSTRACT

The present invention provides a flexible substrate with a high dielectric-constant film and a manufacturing method thereof. The manufacturing method comprises following steps: providing a flexible substrate; forming a polysilicon layer on the flexible substrate; coating an HfAlOx solution on the polysilicon layer and forming an HfAlOx insulating layer by baking or annealing the HfAlOx solution; forming a metal gate electrode on the HfAlOx insulating layer; and doping and activating the polysilicon layer to form a source/drain electrode. The metal gate electrode is spaced apart from the source/drain electrode by the HfAlOx insulating layer.

10 Claims, 4 Drawing Sheets

(51) Int. Cl.
*H01L 29/49* (2006.01)
*H01L 29/40* (2006.01)
*H01L 29/66* (2006.01)
*H01L 29/786* (2006.01)

(52) U.S. Cl.
CPC ...... *H01L 21/28158* (2013.01); *H01L 29/401* (2013.01); *H01L 29/66757* (2013.01); *H01L 29/78603* (2013.01); *H01L 29/78675* (2013.01); *H01L 21/02178* (2013.01); *H01L 21/02181* (2013.01)

(58) Field of Classification Search
CPC ......... H01L 29/78675; H01L 21/28158; H01L 21/02181; H01L 21/02178; H01L 29/4908; H01L 29/401
See application file for complete search history.

(56) References Cited

U.S. PATENT DOCUMENTS

| | | | | |
|---|---|---|---|---|
| 2007/0077701 A1* | 4/2007 | O'Meara | ........... | H01L 21/28194 438/240 |
| 2010/0317200 A1* | 12/2010 | Onizawa | ............... | H01L 21/324 438/795 |
| 2013/0161587 A1* | 6/2013 | Xianyu | ............... | H01L 27/1266 257/29 |
| 2016/0007441 A1* | 1/2016 | Matsueda | ........... | H01L 51/0097 361/749 |
| 2020/0127127 A1* | 4/2020 | Jin | ...................... | H01L 29/7869 |

* cited by examiner

FLEXIBLE SUBSTRATE WITH HIGH DIELECTRIC-CONSTANT FILM AND MANUFACTURING METHOD THEREOF

RELATED APPLICATIONS

This application is a National Phase of PCT Patent Application No. PCT/CN2019/075337 having International filing date of Feb. 18, 2019, which claims the benefit of priority of Chinese Patent Application No. 201811470216.9 filed on Dec. 4, 2018. The contents of the above applications are all incorporated by reference as if fully set forth herein in their entirety.

FIELD AND BACKGROUND OF THE INVENTION

The present invention relates to a field of display devices and, in particular, to a flexible substrate with a high dielectric-constant film and a manufacturing method thereof.

As a core component in flat panel displays, a thin-film transistor (TFT) plays an important role in improving display performance and widening display applications. A threshold voltage, a subthreshold swing, and field-effect mobility of the thin film transistor is directly influenced by electrical properties of a gate insulating layer of a TFT device and by interface properties between the gate insulating layer and a channel of an active layer. As shown in FIG. 1, the gate insulating layer 1 of the TFT device is currently produced by using silicon oxide/silicon nitride (SiOx/SiNx) as an insulating layer to separate the gate electrode 2 from the source electrode 4 and the drain electrode 5 at two sides of the polysilicon layer 3. However, as development of flexible display devices, the display device tends to be ultra-thin, and the SiOx/SiNx insulating layer increases a leakage current due to a quantum tunneling effect, resulting in an increase in power consumption of the display device and thereby affecting normal operations of the display device. In addition, in a conventional process for producing a gate insulating layer, chemical vapor deposition (CVD) or physical vapor deposition (PVD) are used for coating, but these manufacturing methods have high requirements on equipment, and a vacuum environment is required, leading to high production costs and a slow production speed.

SUMMARY OF THE INVENTION

As development of flexible display devices, display devices tend to be ultra-thin, and the SiOx/SiNx insulating layer has an increased leakage current due to a quantum tunneling effect, resulting in increased power consumption of the display device and affecting normal operations of the display device. In addition, in a conventional process for producing a gate insulating layer, chemical vapor deposition (CVD) or physical vapor deposition (PVD) are used for coating, but these manufacturing methods have high requirements on equipment, and a vacuum environment is required, thereby causing high production costs, and a slow production speed.

The present invention provides a flexible substrate with a high dielectric-constant film and a manufacturing method thereof, which effectively reduce a leakage current of a flexible display device, decreases a threshold voltage, improves an effect of regulating a current between a metal gate electrode and a source/drain electrode, and reducing power consumption of the display device.

Accordingly, the present invention provides a manufacturing method of a flexible substrate with a high dielectric-constant film, comprising steps as follows:

S10: providing a flexible substrate;
S20: forming a polysilicon layer on the flexible substrate;
S30: coating an HfAlOx solution on the polysilicon layer and forming an HfAlOx insulating layer by baking the HfAlOx solution;
S40: forming a metal gate electrode on the HfAlOx insulating layer; and
S50: doping and activating the polysilicon layer to form a source/drain electrode, wherein the metal gate electrode is spaced apart from the source/drain electrode by the HfAlOx insulating layer, the HfAlOx solution is made by adding hafnium tetrachloride (HfCl4) powder and aluminum nitrate nonahydrate (Al(NO3)3.9H2O) into ethylene glycol methyl ether as a solvent.

According to one embodiment of the present invention, the HfAlOx solution has a concentration of 0.2 mol/L.

According to one embodiment of the present invention, a molar ratio of Hf to Al in the HfAlOx solution is n(Hf):n(Al)=2:1.

According to one embodiment of the present invention, step S30 further comprises annealing the HfAlOx solution to form the HfAlOx insulating layer, and a thickness of the HfAlOx insulating layer is 10 nm.

The present invention provides a flexible substrate with a high dielectric-constant film, comprising:

a flexible substrate;
a polysilicon layer disposed on the flexible substrate;
an HfAlOx insulating layer, the HfAlOx insulating layer being developed on the polysilicon layer by baking an HfAlOx solution;
a metal gate electrode disposed on the HfAlOx insulating layer; and
a source/drain electrode disposed on the polysilicon layer, wherein the metal gate electrode is spaced apart from the source/drain electrode by the HfAlOx insulating layer.

According to one embodiment of the present invention, a thickness of the HfAlOx insulating layer is 10 nm.

The present invention further provides a manufacturing method of a flexible substrate with a high dielectric-constant film, comprising steps as follows:

S10: providing a flexible substrate;
S20: forming a polysilicon layer on the flexible substrate;
S30: coating an HfAlOx solution on the polysilicon layer and baking the HfAlOx solution to form an HfAlOx insulating layer;
S40: forming a metal gate electrode on the HfAlOx insulating layer; and
S50: doping and activating the polysilicon layer to form a source/drain electrode, wherein the metal gate electrode is spaced apart from the source/drain electrode by the HfAlOx insulating layer.

According to one embodiment of the present invention, in step S30, the HfAlOx solution is made by adding hafnium tetrachloride (HfCl4) powder and aluminum nitrate nonahydrate (Al(NO3)3.9H2O) into ethylene glycol methyl ether as a solvent.

According to one embodiment of the present invention, the HfAlOx solution has a concentration of 0.2 mol/L.

According to one embodiment of the present invention, a molar ratio of Hf to Al in the HfAlOx solution is n(Hf):n(Al)=2:1.

According to one embodiment of the present invention, step S30 further comprises annealing the HfAlOx solution to form the HfAlOx insulating layer, and a thickness of the HfAlOx insulating layer is 10 nm.

According to one embodiment of the present invention, before formation of the metal gate electrode, step S40 further comprises depositing a metal layer on the HfAlOx insulating layer, and forming the metal gate electrode by exposure, development and etching of the metal layer.

According to one embodiment of the present invention, step S20 further comprises depositing amorphous silicon (a-Si) on the flexible substrate and forming the polysilicon layer by dehydrogenation, crystallization, exposure, development, and etching.

According to one embodiment of the present invention, before step S10, the manufacturing method further comprises providing a glass substrate, coating a flexible substrate solution on the glass substrate, and developing the flexible substrate by using a high-level output voltage (HVDD) and an oven, and the flexible substrate is made of polyimide (PI).

The present invention has the following advantages:

1. The present invention utilizes a high-k dielectric constant material, i.e. HfAlOx, to replace a conventional gate insulating layer made of SiOx/SiNx, thus effectively reducing a leakage current of a display device, decreasing a threshold voltage, improving an effect of regulating a current between a metal gate electrode and a source/drain electrode, and reducing power consumption of the display device.

2. The use of HfAlOx which is a high dielectric constant material can effectively reduce a thickness of a TFT device, so HfAlOx is more suitable for use in a flexible display device.

3. Preparing the gate insulating layer by using the HfAlOx solution can simplify operations, reduce production costs, and increase a production speed.

HfAlOx is a material which has a high dielectric constant (High-k) and a high crystallization temperature, and HfAlOx and the silicon substrate have good thermal stability and an excellent interface performance, so HfAlOx is an ideal alternative to SiOx/SiNx which is a conventional material. In addition, by using the HfAlOx solution to prepare the gate insulating layer, the present invention has low requirements on equipment and enables simple operations, and materials/compositions are easy to control, so production costs can be effectively reduced.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DESCRIPTION OF SPECIFIC EMBODIMENTS OF THE INVENTION

The word "embodiment" mentioned in the detailed description means that a particular feature, structure, or characteristic described in connection with the embodiment may be included in at least one embodiment of the invention. The same terms appearing in different places in the specification are not necessarily limited to the same embodiment, but can belong to independent or alternative embodiments. In view of the technical solutions disclosed in the embodiments of the present invention, those skilled in the art should understand that the embodiments described herein may have other combinations or variations based on inventive concepts of the technical solutions.

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
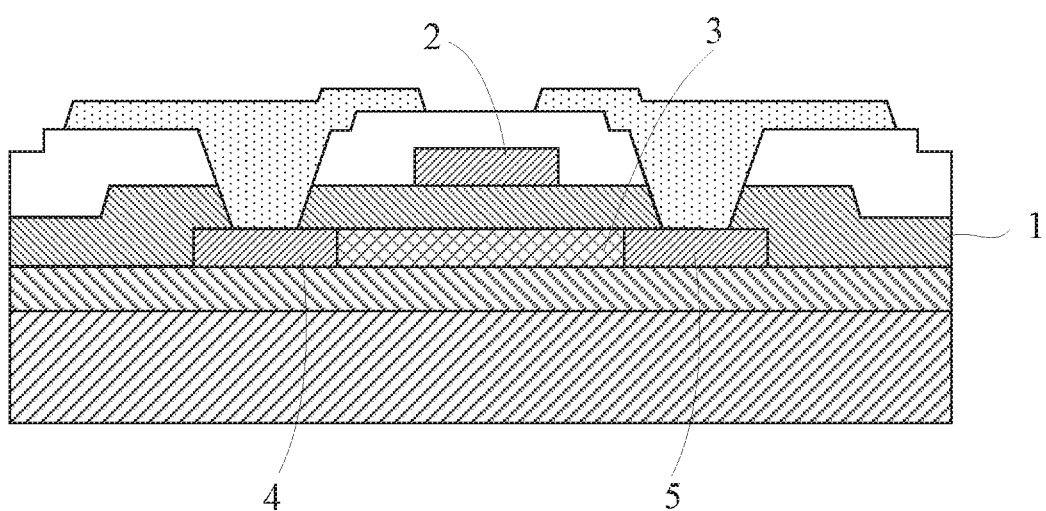
FIG. 1 is a schematic cross-sectional view illustrating a structure of a conventional flexible substrate.
Figure 2:
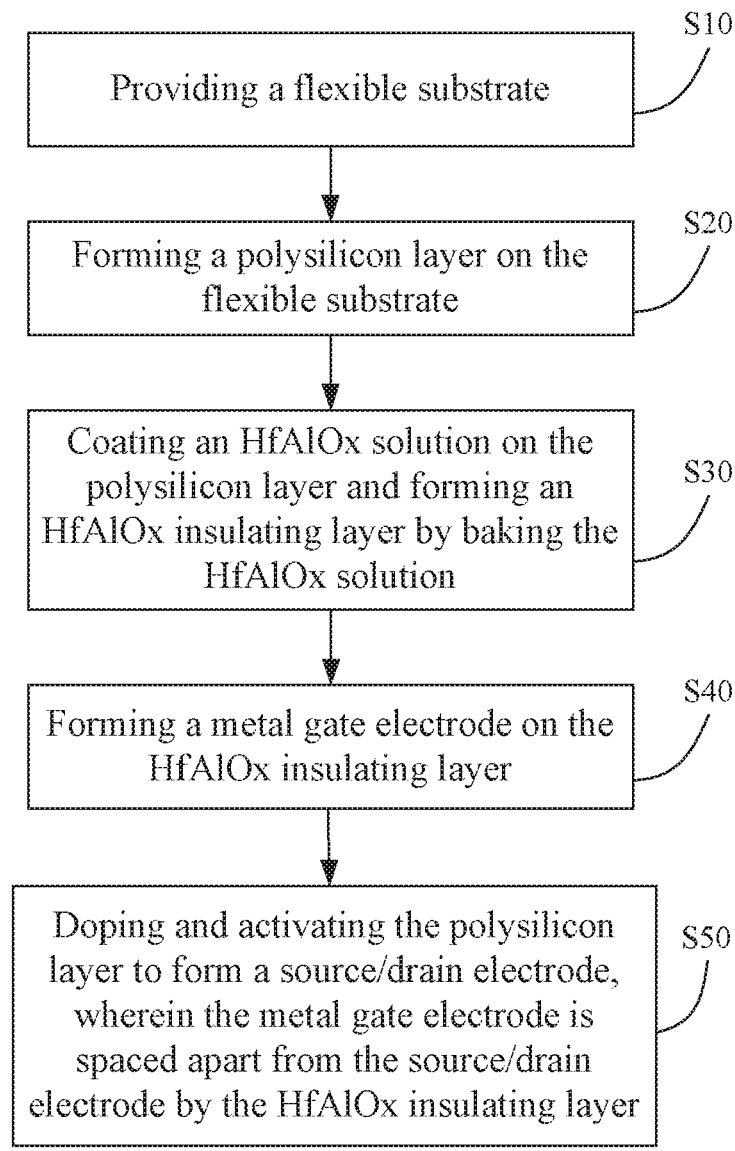
FIG. 2 is a process flow diagram illustrating a manufacturing method of a flexible substrate with a high dielectric-constant film according to the present invention.
Figure 3:
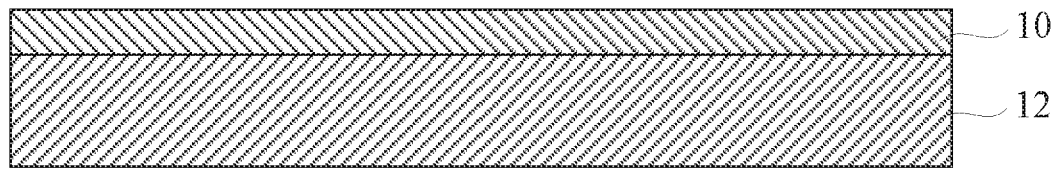
FIGS. 3, 4, 5, 6 and 7 are schematic cross-sectional views illustrating the manufacturing method of the flexible substrate with the high dielectric-constant film according to the present invention.

FIG. 2 is a process flow diagram illustrating a manufacturing method of a flexible substrate with a high dielectric-constant film according to the present invention. FIGS. 3 to 7 are schematic cross-sectional views illustrating the manufacturing method of the flexible substrate with the high dielectric-constant film according to the present invention. As shown in FIGS. 2 to 7, the present invention provides the manufacturing method of the flexible substrate with the high dielectric-constant film, comprising steps as follows:

S10: providing a flexible substrate 10;

S20: forming a polysilicon layer 14 on the flexible substrate 10;

S30: coating an HfAlOx solution on the polysilicon layer 14 and forming an HfAlOx insulating layer 16 by baking the HfAlOx solution;

S40: forming a metal gate electrode 18 on the HfAlOx insulating layer 16; and

S50: doping and activating the polysilicon layer 14 to form a source/drain electrode 20, wherein the metal gate electrode 18 is spaced apart from the source/drain electrode 20 by the HfAlOx insulating layer 16.

Before step S10, the manufacturing method further comprises providing a glass substrate 12, coating a flexible substrate solution (not illustrated) on the glass substrate 12, and developing the flexible substrate 10 by using a high-level output voltage (HVDD) and an oven (OVEN). In the embodiment shown in FIG. 3, the flexible substrate 10 is preferably made of polyimide (PI).

Figure 4:
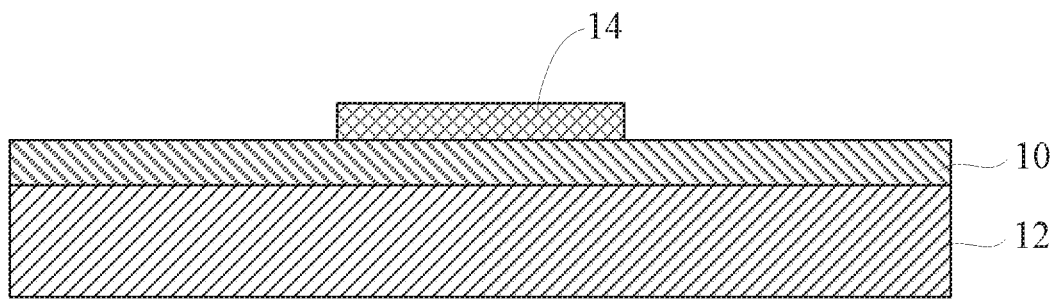

Referring to FIG. 4, step S20 further comprises depositing amorphous silicon (a-Si) on the flexible substrate 10 and forming the polysilicon layer 14 by dehydrogenation, crystallization, exposure, development, and etching.

Figure 5:
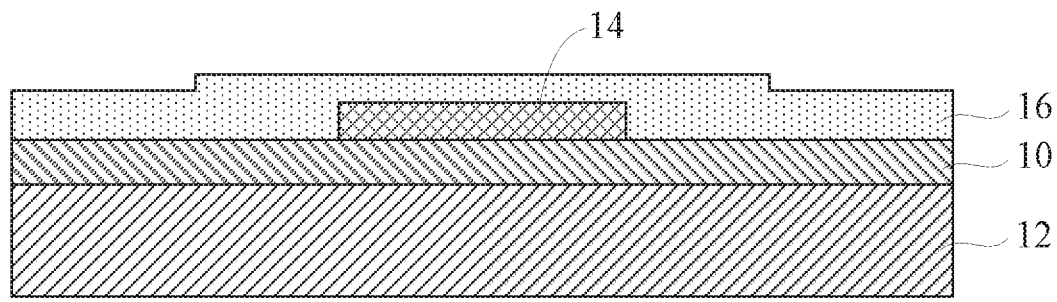

Referring to FIG. 5, in step S30, the HfAlOx solution is made by adding hafnium tetrachloride (HfCl4) powder and aluminum nitrate nonahydrate (Al(NO3)3.9H2O) into ethylene glycol methyl ether ($HOCH_2CH_2OCH_3$) as a solvent. In details, the HfCl4 powder which is an inorganic compound is added to Al(NO3)3.9H2O in the form of hydrate crystals, and then the HfCl4 powder and Al(NO3)3.9H2O are added into the $HOCH_2CH_2OCH_3$ solvent to prepare the HfAlOx solution.

The HfAlOx solution has a concentration of 0.2 mol/L. A molar ratio of Hf to Al in the HfAlOx solution is n(Hf):n(Al)=2:1. Step S30 further comprises annealing the HfAlOx solution to form the HfAlOx insulating layer 16, and a thickness of the HfAlOx insulating layer 16 is 10 nm.

Figure 6:
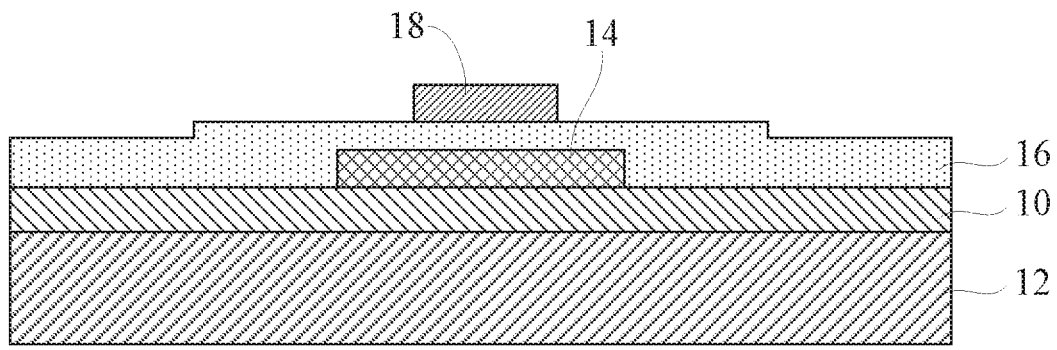

Referring to FIG. 6, step S40 further comprises depositing a metal layer (not illustrated) on the HfAlOx insulating layer 16 and forming the metal gate electrode 18 by exposure, development and etching of the metal layer. The HfAlOx insulating layer 16 covers the polysilicon layer 14 and separates it from the metal gate electrode 18.

Figure 7:
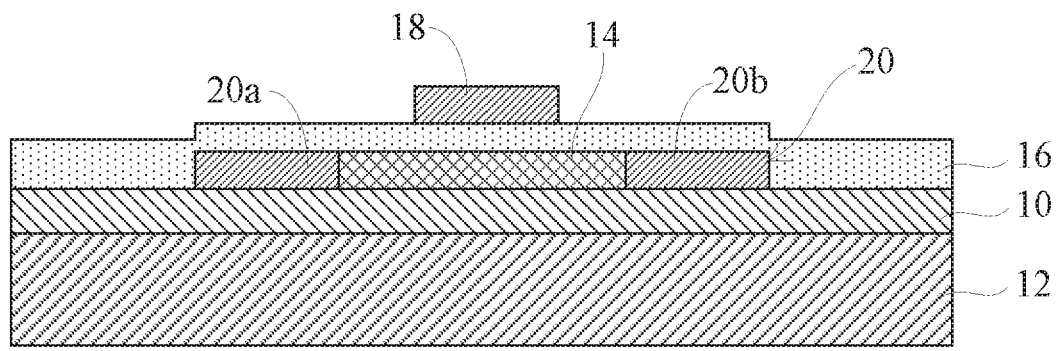

Referring to FIG. 7, in step S50, the source electrode 20a and the drain electrode 20b are formed at two sides of the polysilicon layer 14, respectively, and are spaced apart from the metal gate 18 by the HfAlOx insulating layer 16, so that a flexible substrate of the present invention has a small thickness and has the HfAlOx insulating layer 16 with good uniformity and low roughness. Of course, after step S50, a protective layer (not shown) such as a glass cover or a scratch-resistant film is further disposed on the metal gate electrode 18 to isolate the metal gate electrode 18 from air.

Referring to FIG. 7, the present invention provides a flexible substrate with a high dielectric-constant film. The flexible substrate with the high dielectric-constant film includes a flexible substrate 10, a polysilicon layer 14, an HfAlOx insulating layer 16, a metal gate electrode 18, and a source/drain electrode 20. The polysilicon layer 14 is disposed on the flexible substrate 10. The HfAlOx insulating layer 16 is developed on the polysilicon layer 14 by baking or annealing an HfAlOx solution. The metal gate electrode 18 is disposed on the HfAlOx insulating layer 16. The source/drain electrode 20 is disposed on the polysilicon layer 14. The metal gate electrode 18 is spaced apart from the source/drain electrode 20 by the HfAlOx insulating layer 16. A thickness of the HfAlOx insulating layer 16 is 10 nm.

Therefore, in the present invention, the HfAlOx insulating layer 16 prepared by using the HfAlOx solution can simplify operations, reduce production costs, increase a production speed, effectively reduce a thickness of the TFT device, and is more suitable for use in a flexible display device. The present invention utilizes the HfAlOx insulating layer 16, which can effectively reduce a leakage current of the display device, reduce a threshold voltage, improve an effect of regulating a current between the metal gate electrode 18 and the source/drain electrode 20, and reduce power consumption of the display device.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A manufacturing method of a flexible substrate with a high dielectric-constant film, comprising steps as follows:
   providing a flexible substrate;
   forming a polysilicon layer on the flexible substrate;
   coating an HfAlOx solution on the polysilicon layer and forming an HfAlOx insulating layer by baking the HfAlOx solution;
   forming a metal gate electrode on the HfAlOx insulating layer; and
   doping and activating the polysilicon layer to form a source/drain electrode, wherein the metal gate electrode is spaced apart from the source/drain electrode by the HfAlOx insulating layer, the HfAlOx solution is made by adding hafnium tetrachloride (HfCl4) powder and aluminum nitrate nonahydrate (Al(NO3)3.9H2O) into ethylene glycol methyl ether as a solvent.

2. The manufacturing method of the flexible substrate with the high dielectric-constant film according to claim 1, wherein the HfAlOx solution has a concentration of 0.2 mol/L.

3. The manufacturing method of the flexible substrate with the high dielectric-constant film according to claim 1, wherein a thickness of the HfAlOx insulating layer is 10 nm.

4. A manufacturing method of a flexible substrate with a high dielectric-constant film, comprising steps as follows:
   providing a glass substrate, coating a flexible substrate solution on the glass substrate to form the flexible substrate, and developing the flexible substrate using a high-level output voltage (HVDD) and an oven, wherein the flexible substrate is made of polyimide (PI);
   forming a polysilicon layer on the flexible substrate;
   coating an HfAlOx solution on the polysilicon layer and baking the HfAlOx solution to form an HfAlOx insulating layer;
   forming a metal gate electrode on the HfAlOx insulating layer; and
   doping and activating the polysilicon layer to form a source/drain electrode, wherein the metal gate electrode is spaced apart from the source/drain electrode by the HfAlOx insulating layer.

5. The manufacturing method of the flexible substrate with the high dielectric-constant film according to claim 4, wherein the HfAlOx solution is made by adding hafnium tetrachloride (HfCl4) powder and aluminum nitrate nonahydrate (Al(NO3)3.9H2O) into ethylene glycol methyl ether as a solvent.

6. The manufacturing method of the flexible substrate with the high dielectric-constant film according to claim 5, wherein the HfAlOx solution has a concentration of 0.2 mol/L.

7. The manufacturing method of the flexible substrate with the high dielectric-constant film according to claim 5, wherein a molar ratio of Hf to Al in the HfAlOx solution is n(Hf):n(Al)=2:1.

8. The manufacturing method of the flexible substrate with the high dielectric-constant film according to claim 4, wherein a thickness of the HfAlOx insulating layer is 10 nm.

9. The manufacturing method of the flexible substrate with the high dielectric-constant film according to claim 4, wherein, before formation of the metal gate electrode, forming the metal gate electrode on the HfAlOx insulating layer comprises depositing a metal layer on the HfAlOx insulating layer and forming the metal gate electrode by exposure, development and etching of the metal layer.

10. The manufacturing method of the flexible substrate with the high dielectric-constant film according to claim 4, wherein the forming the polysilicon layer on the flexible substrate comprises depositing amorphous silicon (a-Si) on the flexible substrate and forming the polysilicon layer by dehydrogenation, crystallization, exposure, development, and etching.

* * * * *